US007857642B1

(12) United States Patent  
Manes

(10) Patent No.: US 7,857,642 B1
(45) Date of Patent: Dec. 28, 2010

(54) INDUCTIVE AMPLIFIER PROBE TIP

(75) Inventor: Dennis L. Manes, Mill Creek, WA (US)

(73) Assignee: Leviton Manufacturing Co., Inc., Melville, NY (US)

( * ) Notice: Subject to any disclaimer, the term of this patent is extended or adjusted under 35 U.S.C. 154(b) by 0 days.

(21) Appl. No.: 12/553,050

(22) Filed: Sep. 2, 2009

(51) Int. Cl.
*H01R 29/00* (2006.01)
(52) U.S. Cl. .................................... 439/169
(58) Field of Classification Search ............. 439/169, 439/482, 289, 219
See application file for complete search history.

(56) References Cited

U.S. PATENT DOCUMENTS

| | | | |
|---|---|---|---|
| 6,688,906 B2 * | 2/2004 | Kimbley | 439/482 |
| 6,809,539 B2 * | 10/2004 | Wada et al. | 324/762 |
| 6,844,738 B2 * | 1/2005 | Kreager et al. | 324/538 |
| 7,641,520 B2 * | 1/2010 | Marino | 439/668 |
| 7,741,835 B2 * | 6/2010 | Tan et al. | 324/158.1 |
| 2005/0037649 A1 * | 2/2005 | LaMeres et al. | 439/169 |
| 2006/0051996 A1 * | 3/2006 | Panzar et al. | 439/169 |

\* cited by examiner

*Primary Examiner*—Jean F Duverne
(74) *Attorney, Agent, or Firm*—Davis Wright Tremaine LLP; George C. Rondeau, Jr.; Heather M. Colburn

(57) ABSTRACT

A probe tip for use with an inductive amplifier unit having an inductive generator circuit connected to an indicator, such as an acoustic transducer. The tip includes a substantially non-conducting inductive member having a distal end insertable into an opening of a communication jack housing contacts and having a keyway portion. The tip includes a conductive member having a first end portion at least partially encased inside the distal end of the inductive member and a second end portion extending outwardly away therefrom. The distal end has a key portion configured to be received inside the keyway portion of the jack. Engagement between the key member and the keyway member prevents lateral movement of the distal end across the contacts inside the opening. The second end portion is connectable to the circuit, which is configured to use the indicator to indicate to a user when the tip detects a signal.

26 Claims, 9 Drawing Sheets

INDUCTIVE AMPLIFIER PROBE TIP

BACKGROUND OF THE INVENTION

1. Field of the Invention

The present invention is directed generally to inductive amplifier units and more particularly to probe tips for use with inductive amplifier units.

2. Description of the Related Art

Mislabeled or unlabeled circuits are a common problem encountered by operators of copper cable networks. When a circuit is unlabeled or mislabeled, it is difficult for a technician to determine the path of the conductors of the circuit and/or the termination points of the circuit because portions of the circuit may be obscured from the view of the technician. Thus, in some circumstances, the conductors cannot simply be visually traced to determine their termination points. Further, even if it is possible to visually trace the conductors of a circuit, doing so may be a time consuming and expensive endeavor.

To overcome these issues, a tone generator is typically used to transmit a tone through the unlabeled or mislabeled circuit. The tone generated by the tone generator is detectable by an inductive amplifier unit, which indicates to the technician when the tone is detected. For example, the inductive amplifier unit may include a light source that lights up when the tone is detected or an audio transducer (e.g., a speaker) that plays an audible tone heard by the technician whenever the inductive amplifier unit detects the tone transmitted by the tone generator.

The inductive amplifier unit may also be used to determine portions of a circuit not conducting the signal. In such applications, the tone generator is used to generate a tone at a first location in the circuit. Then, the inductive amplifier unit is used to determine whether the tone is detectable at a second location in the circuit. If the tone is detectable, the circuit is transmitting the signal through the portion of the circuit located between the tone generator and the inductive amplifier unit. If the tone is not detected, a discontinuity or break in the conductor of the circuit exists between the tone generator and the inductive amplifier unit.

The inductive amplifier unit includes a body portion and a probe tip. The body portion is generally designed to be gripped by the technician during use. The body portion houses an electronic circuit that detects the tone and signals its detection to the technician. Such a circuit is typically referred to as an inductive generator circuit. The body portion may also include one or more batteries used to power the inductive amplifier unit.

The probe tip is placed in physical contact with a portion of the circuit (e.g., a termination point, conductor, and the like) or placed near enough to the circuit to detect the presence of the tone. The probe tip is constructed from a material that is inductive but not conductive. The probe tip is generally elongated and has a distal most portion designed to fit inside the opening of a jack (e.g., an RJ-45 style jack, an RJ-11 style jack, and the like) and be placed adjacent to jack tines therein. Typically, the probe tip has a tapered shape that narrows toward its distal most portion. Some prior art probe tips are generally cone shaped with a rounded (or blunt) distal most portion, or duckbill shaped with a flattened distal most portion.

Raking refers to the passage of the probe tip across the jack tines in a continuous sweeping movement. Raking the probe tip across the jack tines may, however, bend or otherwise damage them. The probe tip must be inserted carefully into the opening of the jack to avoid damaging the jack tines but this requires an increased level of care and slows down the technician's work. The chances one or more jacks will be damaged increases with the number of jacks into which the probe tip is inserted. A typical patch panel includes a plurality of jacks. Therefore, the technician may need to insert the probe tip carefully into more than one jack to determine a termination point of a particular circuit.

Thus, a need exists for methods and devices that reduce the likelihood a technician will damage a jack when inserting a probe tip of an inductive amplifier unit into a jack to test it for the presence of a tone generated by a tone generator coupled to a portion of a circuit. The present application provides these and other advantages as will be apparent from the following detailed description and accompanying figures.

BRIEF DESCRIPTION OF THE SEVERAL VIEWS OF THE DRAWING(S)

DETAILED DESCRIPTION OF THE INVENTION

Figure 1:
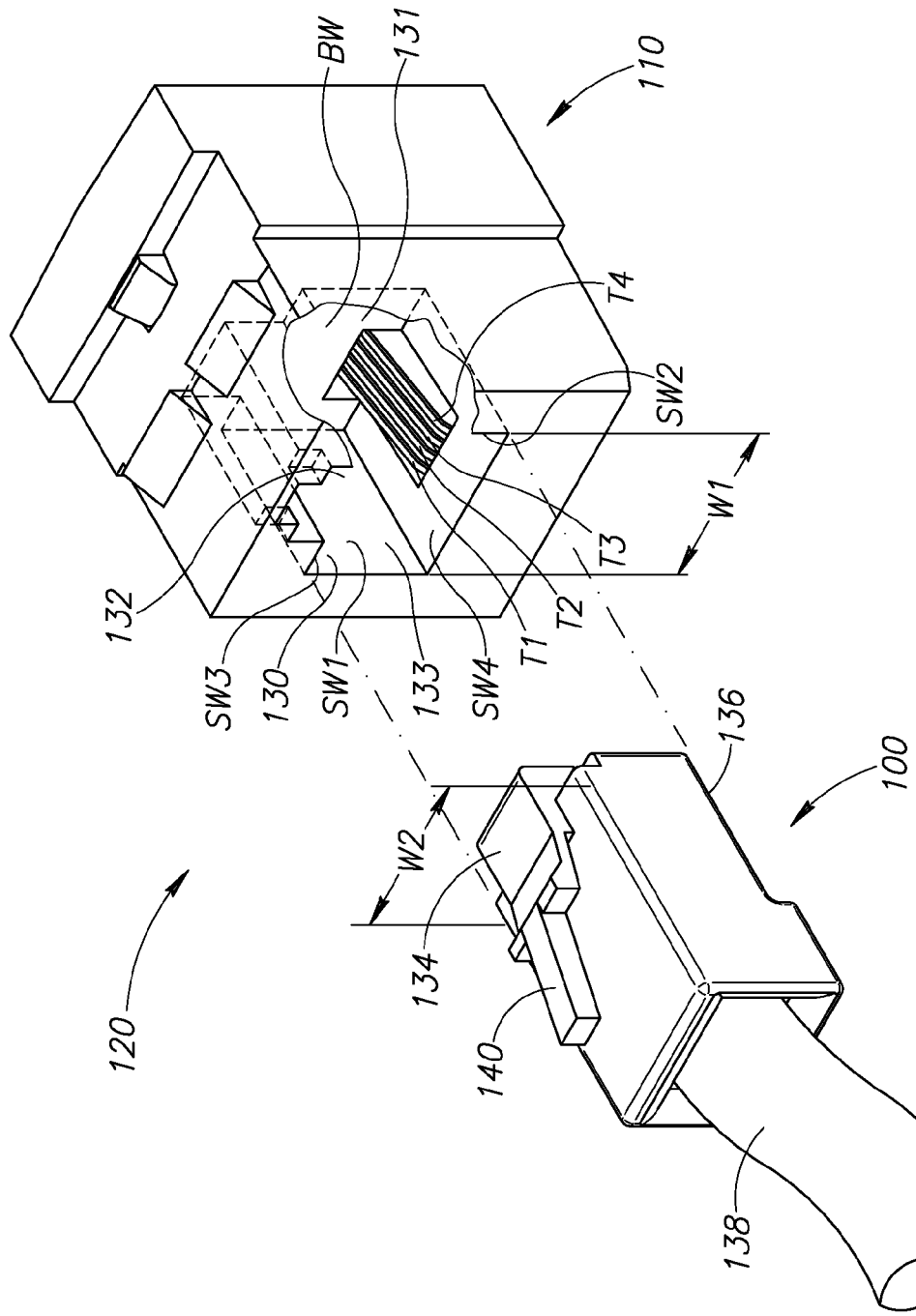
FIG. 1 is a perspective view of a prior art plug and a prior art jack.

Referring to FIG. 1, an illustration of a prior art communication plug 100 and a prior art communication jack 110 are provided. The jack 110 has been illustrated with a portion cut away to provide a view of selected structures inside the jack. A communication connector 120 is formed by inserting the plug 100 into an opening 130 of the jack 110. The connector 120 may be implemented in accordance with any communication standard, including the RJ-11 standard, RJ-12 standard, RJ-45 standard, and the like. Thus, each of the plug 100 and the jack 110 may be constructed in accordance with any such communication standards. For ease of illustration, the plug 100 has been illustrated as a RJ-11 type plug, and the jack 110 has been illustrated as RJ-11 type jack.

The opening 130 is defined between a first sidewall "SW1," a second "SW2" spaced apart from the first sidewall "SW1," a third sidewall "SW3" extending between the first and second sidewalls "SW1" and "SW2," and a fourth sidewall "SW4" spaced apart from the third sidewall "SW3" and extending between the first and second sidewalls "SW1" and "SW2." A first width "W1" is defined between the first and second sidewalls "SW1" and "SW2. The plug 100 has a second width "W2" that is somewhat smaller than the first width "W1" so that the plug may be received inside the opening 130 between the first and second sidewalls "SW1" and "SW2."

The opening 130 includes a keyway portion 132 and a non-keyway portion 133. In the embodiment illustrated, the keyway portion 132 is formed in the third sidewall "SW3." Inside the non-keyway portion 133 of the opening 130, the jack 110 includes a plurality of contacts illustrated as tines T1-T4. In the embodiment illustrated, the tines T1-T4 are adjacent the fourth transverse sidewall "SW4. The tines T1-T4 are flexible and if flexed too far may be bent, misaligned, or otherwise damaged.

The depth of insertion of the plug 100 into the jack 110 is determined by a stop mechanism 131. In the embodiment illustrated, the stop mechanism has been illustrated as a back wall "BW." However, other implementations of stop mechanisms are well known in the art and the invention is not limited to a particular implementation. By way of non-limiting examples, the stop mechanism 131 may be implemented using one or more internal inwardly extending portions of the sidewalls "SW1," "SW2," "SW3," and "SW4," one or more inwardly extending flanges, and the like.

The stop mechanism 131 may be disposed inside the keyway portion 132 and/or the non-keyway portion 133 of the jack 110. In the embodiment illustrated, the stop mechanism 131 extends between sidewalls "SW1," "SW2," "SW3," and "SW4" in both the keyway portion 132 and the non-keyway portion 133. Further, each of the sidewalls "SW1," "SW2," "SW3," and "SW4" intersects with and is terminated by the back wall "BW."

The plug 100 includes a keyed portion 134 configured to be received inside the keyway portion 132 of the opening 130 of the jack 110. The keyed portion 134 ensures that the plug 100 is in a proper orientation and correctly aligned relative to the jack 110 when the plug is inserted into the opening 130 of the jack 110. The plug 100 also includes a non-keyed portion 136 having a plurality of contacts (not shown). The non-keyed portion 136 is configured to be received inside the non-keyway portion 133 of the opening 130 of the jack 110. In the embodiment illustrated, the non-keyed portion 136 is adjacent the keyed portion 134. However, this is not a requirement and embodiments in which the non-keyed portion 136 and the keyed portion 134 are in different locations relative to one another are also within the scope of the present teachings. The contacts (not shown) of the plug 100 are in electrical communication with a communication cable 138 connected to the plug 100. Adjacent the keyed portion 134, the plug 100 includes a locking lever 140 that locks or otherwise helps retain the plug 100 inside the jack 110.

When the plug 100 is inserted into the opening 130 (see FIG. 1) of the jack 110 (see FIG. 1), the non-keyed portion 136 may exert force on the tines T1-T4 in the non-keyway portion 133 of the opening 130, and in some implementations, may cause the tines to deflect. In response, the tines T1-T4 may apply a contact force to the non-keyed portion 136 (e.g., to the contacts of the plug 100) that may help maintain an electrical connection between the tines T1-T4 and the contacts (not shown) of the plug 100. While this may be desirable when establishing an electrical connection between the tines T1-T4 and the contacts (not shown) of the plug 100, it is undesirable and unnecessary when using a probe tip to detect inductively a signal inside the jack 110.

Figure 2:
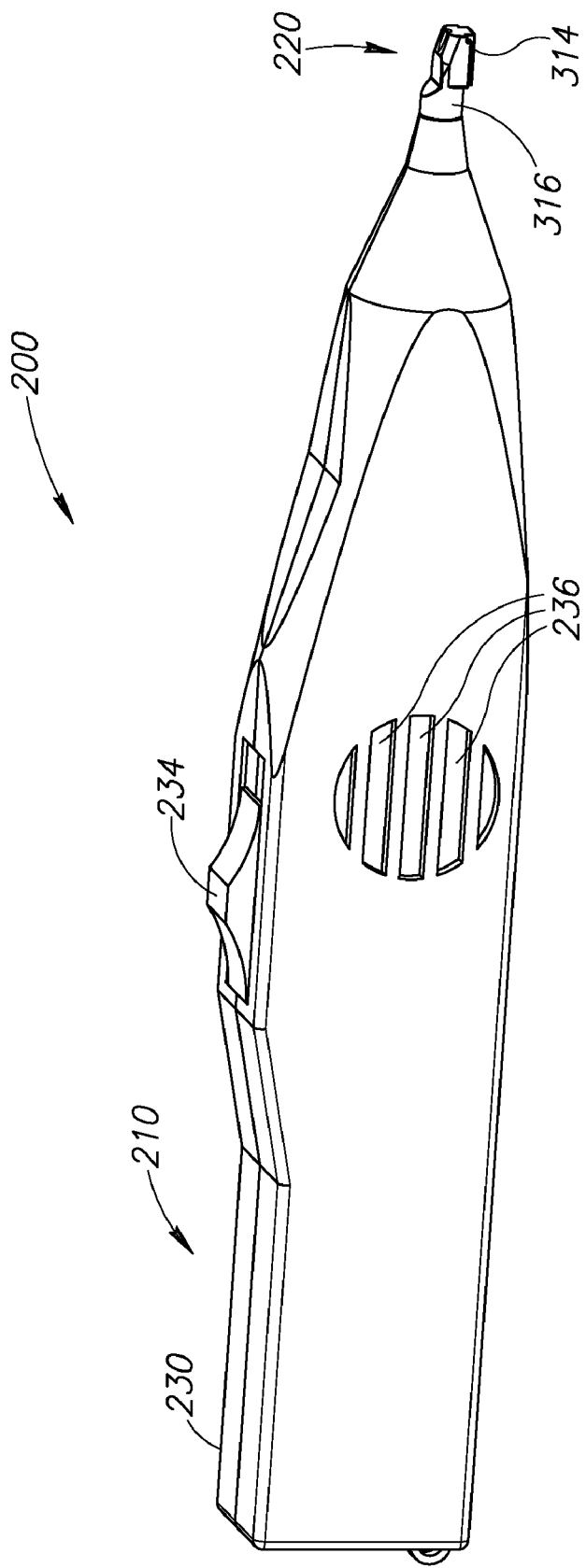
FIG. 2 is a perspective view of an inductive amplifier unit having a probe tip.

As discussed above in the Background Section, a probe tip of a conventional inductive amplifier unit may be inserted into the opening 130 of the jack 110 and once therein, raked across the tines T1-T4 of the jack 110 by a user causing damage to the tines. FIG. 2 illustrates a typical inductive amplifier unit 200 having a body portion 210. The body portion 210 is generally designed to be gripped by a user during use. FIG. 2 also illustrates a probe tip 220 configured to be inserted into the opening 130 but to also prevent it being raked across the tines T1-T4 (see FIG. 1) of the jack 110 (see FIG. 1) by the user. The body portion 210 includes an outer casing 230 and a manually operated power switch 234. The outer casing 230 may be configured to be handheld. One or more sound emitting through-holes 236 may be formed in the outer casing 230.

Figure 3:
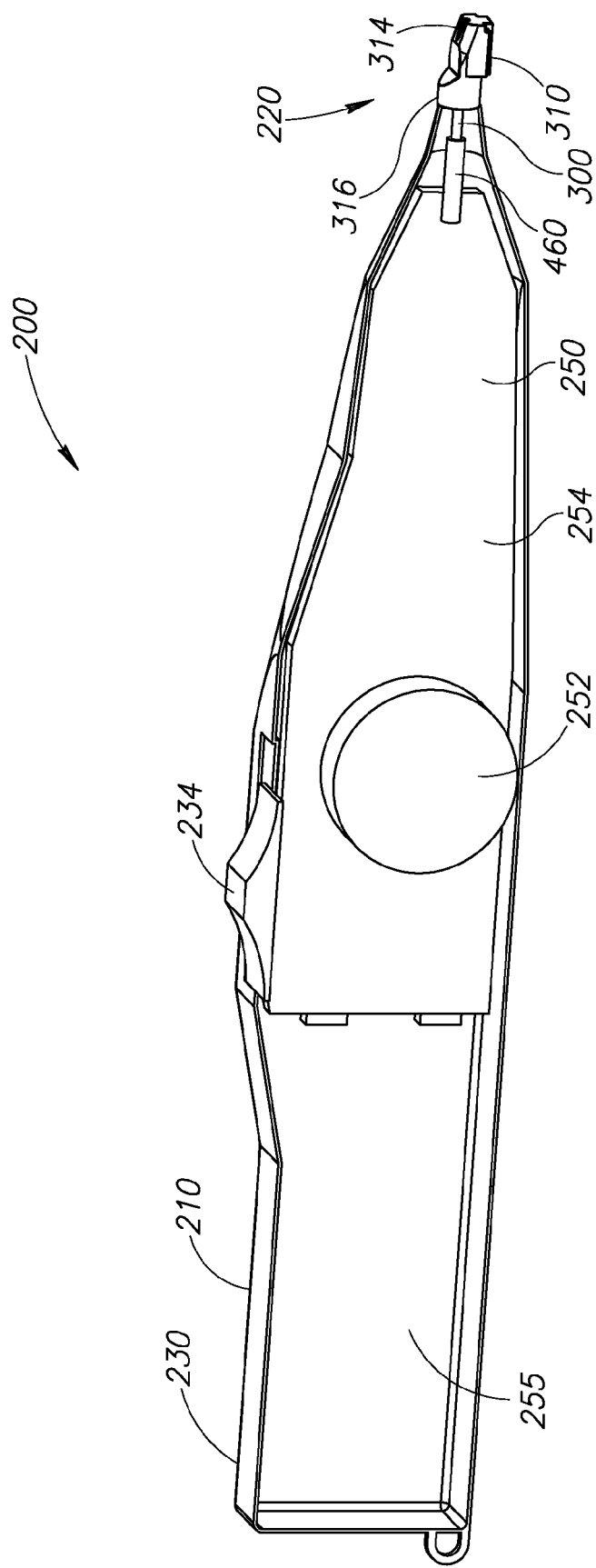
FIG. 3 is a perspective view of the inductive amplifier unit of FIG. 2 with a portion of its outer casing removed.

Turning to FIG. 3, the outer casing 230 houses an inductive generator circuit 250 connected to the probe tip 220 and configured to produce a signal detectable by a user when the probe tip 220 inductively detects a signal in a conductor of a circuit. The signal in the conductor may be produced by a tone generator coupled to the conductor. In the embodiment illustrated, the inductive generator circuit 250 is formed on a circuit board 254. The body portion 210 may include a compartment 255 configured to house one or more batteries (not shown) that provide power to the inductive generator circuit 250.

In the embodiment illustrated, the inductive generator circuit 250 includes an audio transducer 252. When a signal is inductively detected by the probe tip 220, the inductive generator circuit 250 generates an audio signal played by the audio transducer 252 as an audible tone detectable by a user. In alternative implementations, the inductive generator circuit 250 may include one or more light sources (not shown). In such implementations, when a signal is inductively detected by the probe tip 220, the inductive generator circuit 250 illuminates the one or more light sources (not shown) to produce light detectable by a user. Inductive generator circuits are well known in the art and will not be described in detail herein.

Figure 4:
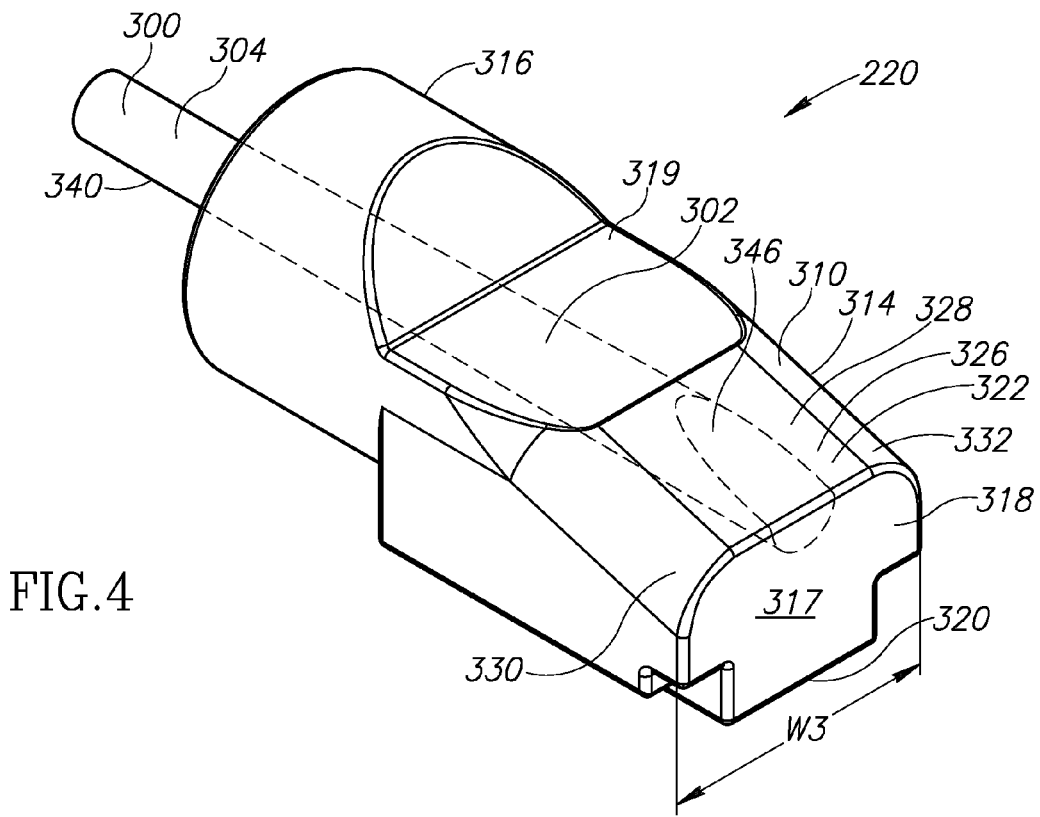
FIG. 4 is an enlarged perspective view of the probe tip of FIG. 2.

FIG. 4 provides an illustration of an exemplary embodiment of the probe tip 220. The probe tip 220 has a conductive member 300 with a distal end portion 302 that is embedded or otherwise encased inside an inductive member 310. The conductive member 300 has a proximal end portion 304 that protrudes from the inductive member 310 and is located outside the inductive member 310. The proximal end portion 304 is configured to be electrically connected to the inductive generator circuit 250 (see FIG. 3). The conductive member 300 may be constructed from a conductive material, such as metals (e.g., steel, aluminum, and the like). The inductive member 310 may be constructed from a substantially non-conductive but inductive material, such as certain plastics. By way of a non-limiting example, suitable plastics which may be used to construct the inductive member 310 include a conductive filled polymer. For example, the inductive member 310 may be constructed from a metal filled polymer subjected to an electric charge that polarizes the plastic as it is being molded. Such materials are commercially available from LNP Engineering Plastics, Inc. of Exton, Pa.

The inductive member 310 has a distal portion 314 configured to be inserted into the opening 130 (see FIG. 1) of the jack 110 (see FIG. 1) and a proximal portion 316 adjacent the body portion 210 (see FIGS. 2 and 3) of the inductive amplifier unit 200. The distal portion 314 has a free first end portion 318 opposite a second end portion 319 coupled to or integrally formed with the proximal portion 316. The free first end portion 318 may be blunt having a flat forward facing surface 317 as opposed to the pointed or tapered ends of prior art probe tips.

The depth of insertion of the probe tip 220 into the opening 130 (see FIG. 1) of the jack 110 (see FIG. 1) is limited by the stop mechanism 131 (see FIG. 1). For example, insertion of the probe tip 220 into the opening 130 (see FIG. 1) may be halted when the flat forward facing surface 317 abuts the back wall "BW" (see FIG. 1).

The distal portion 314 is configured such that when it is inserted into the opening 130 (see FIG. 1) of the jack 110 (see FIG. 1), the distal portion 314 cannot be moved inside the jack in such a manner as to damage the tines T1-T4 (see FIG. 1) of the jack. Therefore, if the user attempts to shake or wiggle the distal portion 314 inside the jack 110 (see FIG. 1), the size and shape of the distal portion 314 ensures that it applies an insufficient amount of force to the tines to damage them or remains adequately spaced from the tines T1-T4 (see FIG. 1) to prevent damaging them.

Unlike the prior art tapered probe tips, the distal portion 314 of the inductive member 310 of the probe tip 220 has a generally rectangular shape configured to mimic the outer shape of the plug 100 (see FIG. 1). For example, the distal portion 314 of the inductive member 310 includes a keyed portion 320 adjacent to a non-keyed portion 322. The keyed portion 320 is configured to be received inside the keyway portion 132 (see FIG. 1) of the opening 130 (see FIG. 1) of the jack 110 (see FIG. 1) and the non-keyed portion 322 is configured to be received inside the non-keyway portion 133 (see FIG. 1) of the opening of the jack. Please note, to insert the probe tip 220 illustrated in FIG. 4 into the jack 110 illustrated in FIG. 1, the probe tip 220 must be rotated 180° to position the keyed portion 320 adjacent the keyway portion 132 of the jack. The keyed portion 320 ensures the distal portion 314 of the inductive member 310 will be inserted into the opening 130 (see FIG. 1) of the jack 110 (see FIG. 1) in the proper orientation thereby avoiding causing damage to the tines T1-T4 (see FIG. 1) of the jack 110. Further, the keyed portion 320 limits rotation of the distal portion 314 inside the opening 130 (see FIG. 1) and helps prevent lateral movement of the distal portion 314 inside the opening 130.

Returning to FIG. 4, the free first end portion 318 of the distal portion 314 has a third width "W3" that is somewhat smaller than the first width "W1" (see FIG. 1) so that the free first end portion 318 may be received inside the opening 130 (see FIG. 1) between the first and second sidewalls "SW1" and "SW2" (see FIG. 1). In particular embodiments, insufficient space may be provided between the free first end portion 318 and the first and second sidewalls "SW1" and "SW2" to allow the probe tip 220 to move laterally between first and second sidewalls "SW1" and "SW2" inside the opening 130 an adequate amount to cause damage to the tines T1-T4 (see FIG. 1). Further, engagement of the keyed portion 320 with the keyway portion 132 (see FIG. 1) of the opening 130 (see FIG. 1) of the jack 110 (see FIG. 1) may prevent the probe tip 220 from moving laterally between first and second sidewalls "SW1" and "SW2" inside the opening 130 an adequate amount to cause damage to the tines T1-T4 (see FIG. 1). In other words, because lateral movement of the probe tip 220 is restricted by the first and second sidewalls "SW1" and "SW2," and/or the keyway portion 132 (see FIG. 1) of the opening 130 (see FIG. 1), the probe tip 220 cannot be raked across the tines T1-T4 (see FIG. 1) adjacent the fourth sidewall "SW4." In this manner, the movement of the probe tip 220 inside the opening 130 (see FIG. 1) of the jack 110 (see FIG. 1) is insufficient to result in the permanent deformation or bending of the tines T1-T4 (see FIG. 1). The distal portion 314 may have a substantially uniform width (e.g., the third width "W3") from its free first end portion 318 to its second end portion 319.

Further, because the distal portion 314 of the inductive member 310 of the probe tip 220 is configured to mimic the outer shape of the plug 100 (see FIG. 1), depending upon the implementation details, the distal portion 314 of the inductive member 310 may occupy a majority portion of the inside of the opening 130 (see FIG. 1). In such embodiments, insufficient space may exist between the distal portion 314 and the sidewalls "SW1," "SW2," "SW3," and "SW4," to permit adequate lateral movement of the distal portion 314 inside the opening 130 to damage the tines T1-T4 (see FIG. 1).

By way of a non-limiting example, the distance between two adjacent tines T1-T4 (see FIG. 1) may be about 0.019 inches to about 0.025 inches. Inside the opening 130 (see FIG. 1), a distance between the probe tip 220 and each of the sidewalls "SW1," "SW2," "SW3," and "SW4" may be limited to between about 0.3 mm and about 1.4 mm. In particular embodiments, the keyed portion 320 and the keyway portion 132 (see FIG. 1) of the opening 130 (see FIG. 1) of the jack 110 (see FIG. 1) may be configured to prevent the probe tip 220 from moving laterally between first and second sidewalls "SW1" and "SW2" inside the opening 130 an adequate amount to cause damage to the tines T1-T4 (see FIG. 1).

Figure 5:
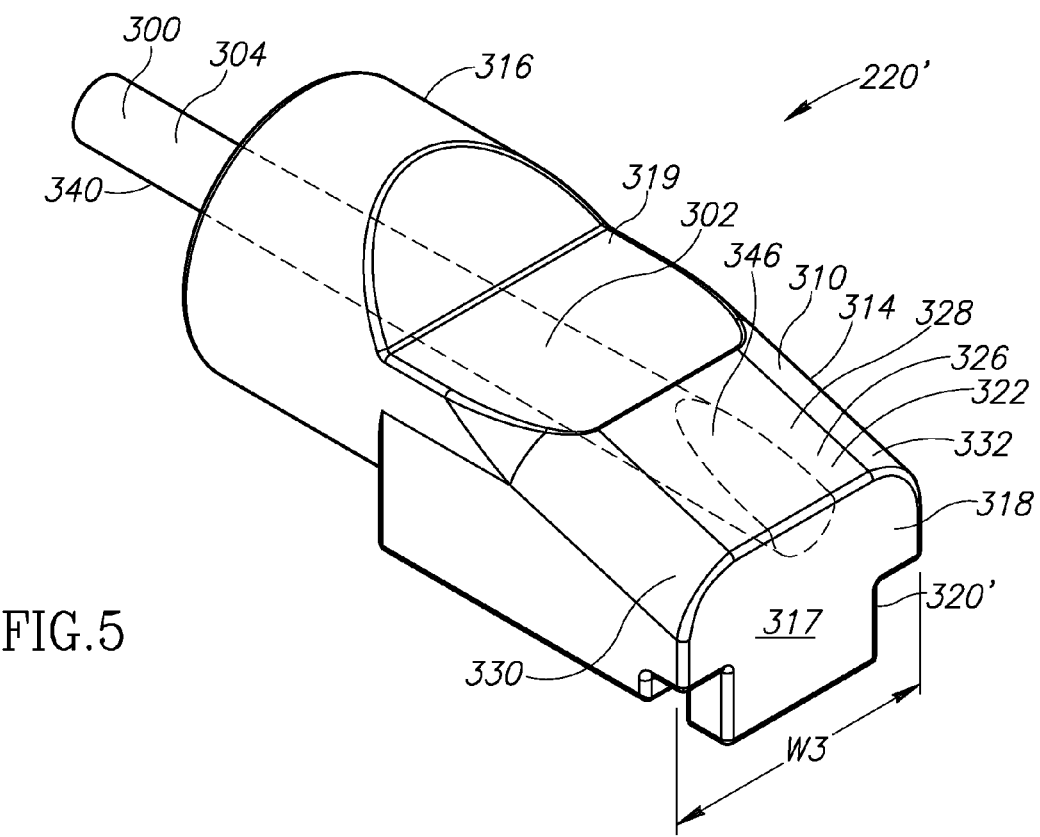
FIG. 5 is an enlarged perspective view of an alternate embodiment of a probe tip for use with the inductive amplifier unit of FIG. 2.

In the embodiment of the probe tip 220 illustrated in FIG. 4, the keyed portion 320 extends outwardly along the distal portion 314 from its free first end portion 318 to its second end portion 319. In an alternate embodiment illustrated in FIG. 5, the keyed portion 320' of a probe tip 220' extends outwardly from the free first end portion 318 and extends along only a portion of the distal portion 314 toward the second end portion 319. Like reference numerals have been used to identify like components of the probe tip 220 and the probe tip 220'.

In particular implementations, the outer shape of the distal portion 314 of the inductive member 310 may be substantially identical to the outer shape of the plug 100 (see FIG. 1). Alternatively, the shape of the distal portion 314 of the inductive member 310 may differ from the shape of the plug 100 (see FIG. 1) in any one or more of the following ways. First, to allow for ease of insertion and removal from the opening 130 (see FIG. 1) of the jack 110 (see FIG. 1), the probe tip 220 does not include the locking lever 140 (see FIG. 1). As mentioned above, referring to FIG. 1, when the plug 100 is inserted into the opening 130 of the jack 110, the non-keyed portion 136 may exert force on the tines T1-T4, and in some implementations, may cause the tines to deflect. While this may be desirable when establishing an electrical connection between the tines T1-T4 and the contacts (not shown) of the plug 100, it may be undesirable or unnecessary when using the probe tip 220 to inductively detect a signal in the jack 110.

Therefore, returning to FIG. 4, the shape of the distal portion 314 of the inductive member 310 may differ from the shape of the plug 100 (see FIG. 1) with respect to the shape of the non-keyed portion 322 of the probe tip 220. For example, the non-keyed portion 322 may be curved, sloped, chamfered, or otherwise relieved so that when its distal portion 326 is adjacent the tines T1-T4 (see FIG. 1) of the jack 110, the amount of force that can be applied by the distal portion 326 of the non-keyed portion 322 to the tines is limited or non-existent.

By way of a non-limiting example, the non-keyed portion 322 may be relieved such that it avoids deflecting the tines T1-T4 (see FIG. 1) of the jack 110 (see FIG. 1) when inserted into the opening 130 (see FIG. 1). Further, the non-keyed portion 322 may be shaped such that an amount of contact force exerted by the tines T1-T4 (see FIG. 1) on the non-keyed portion 322 of the probe tip 220 is insufficient to maintain the probe tip 220 inside the opening 130 (see FIG. 1) without the application of an additional inwardly directed force (e.g., an inwardly directed force applied to the body portion 210 (see FIGS. 2 and 3) of the inductive amplifier unit 200 (see FIGS. 2 and 3) by the user).

In the embodiment illustrated, the non-keyed portion 322 includes a relieved portion 328 that is adjacent the tines T1-T4 (see FIG. 1) of the jack 110 (see FIG. 1) when the probe tip 220 is fully inserted into the opening 130 (see FIG. 1). The relieved portion 328 may be configured to avoid contact with the tines T1-T4 (see FIG. 1) when the probe tip 220 is fully inserted into the opening 130 (see FIG. 1). Alternatively, the relieved portion 328 may be configured to contact but not to significantly deflect the tines T1-T4 (see FIG. 1) when the probe tip 220 is fully inserted into the opening 130 (see FIG. 1).

As mentioned above, the depth of insertion of the probe tip 220 into the opening 130 (see FIG. 1) of the jack 110 (see FIG. 1) is limited by the stop mechanism 131 (see FIG. 1). Therefore, engagement between the probe tip 220 and the stop mechanism 131 (see FIG. 1) determines at least in part the positioning of the relieved portion 328 relative to the tines T1-T4 (see FIG. 1). The relieved portion 328 may be configured to exert at most a predetermined amount of contact force on the tines T1-T4 (see FIG. 1) when the probe tip 220 engages with the stop mechanism 131 (see FIG. 1). Alternatively, the relieved portion 328 may be configured to avoid contact with the tines T1-T4 (see FIG. 1) entirely.

In the embodiment illustrated, the relieved portion 328 is tapered toward the distal portion 326 of the non-keyed portion 322. Further, the non-keyed portion 322 may include rounded side portions 330 and 332 adjacent the relieved portion 328. In some implementations, all edges and corners of the distal portion 314 of the inductive member 310 are relieved (e.g., rounded, chamfered, and the like) to prevent any edges or corners from bending the tines T1-T4 (see FIG. 1) of the jack 110 (see FIG. 1) or otherwise causing damage thereto.

Relieving the edges and corners of the distal portion 314 of the inductive member 310 may also facilitate easy insertion and removal of the probe tip 220. Further, relieving the edges and corners of the distal portion 314 of the inductive member 310 may help prevent the probe tip 220 from frictionally engaging the sidewalls "SW1," "SW2," "SW3," and/or "SW4" (see FIG. 1) defining the opening 130 (see FIG. 1) of the jack 110 (see FIG. 1) and becoming stuck and/or hung up inside the opening 130 (see FIG. 1) or being temporarily intentionally left inside and supported by the jack while the technician releases his grip on the body portion 210, which could result in the inductive amplifier unit remaining inside the opening of the jack without the application of an additional inwardly directed force by the user or support by the hand of the user.

If the probe tip 220 were to become stuck and/or hung up inside the opening 130 (see FIG. 1) or left inside the opening without support of the user's hand, the inductive amplifier unit 200 (see FIGS. 2 and 3) may protrude outwardly from the jack 110 (see FIG. 1) unattended by the user and could result in damage to the jack or other equipment. Further, should the inductive amplifier unit 200 (see FIGS. 2 and 3) unexpectedly disengage from the jack 110 (see FIG. 1), the inductive amplifier unit may fall and become damaged and/or injure the user.

In the embodiment illustrated in FIG. 4, the conductive member 300 is implemented as an elongated shaft or rod 340 that extends from outside the inductive member 310 through the proximal portion 316 into the second end portion 319 of the distal portion 314 and at least partially through the distal portion 314 of the inductive member 310. While the conductive member 300 is illustrated as terminating at a location adjacent the free first end portion 318, this is not a requirement. In alternate embodiments, the conductive member 300 may terminate at a location inside the distal portion 314 and spaced from the free first end portion 318. A portion 346 of the distal end portion 302 of the conductive member 300 may be relieved to conform to the shape of the non-keyed portion 322 to avoid breaking or otherwise extending beyond the surface of the non-keyed portion 322. By enclosing the distal end portion 302 of the conductive member 300 entirely within the inductive member 310, the conductive member 300 is prevented from creating a short circuit between two or more of the tines T1-T4 (see FIG. 1) of the jack 110 (see FIG. 1).

Figure 6:
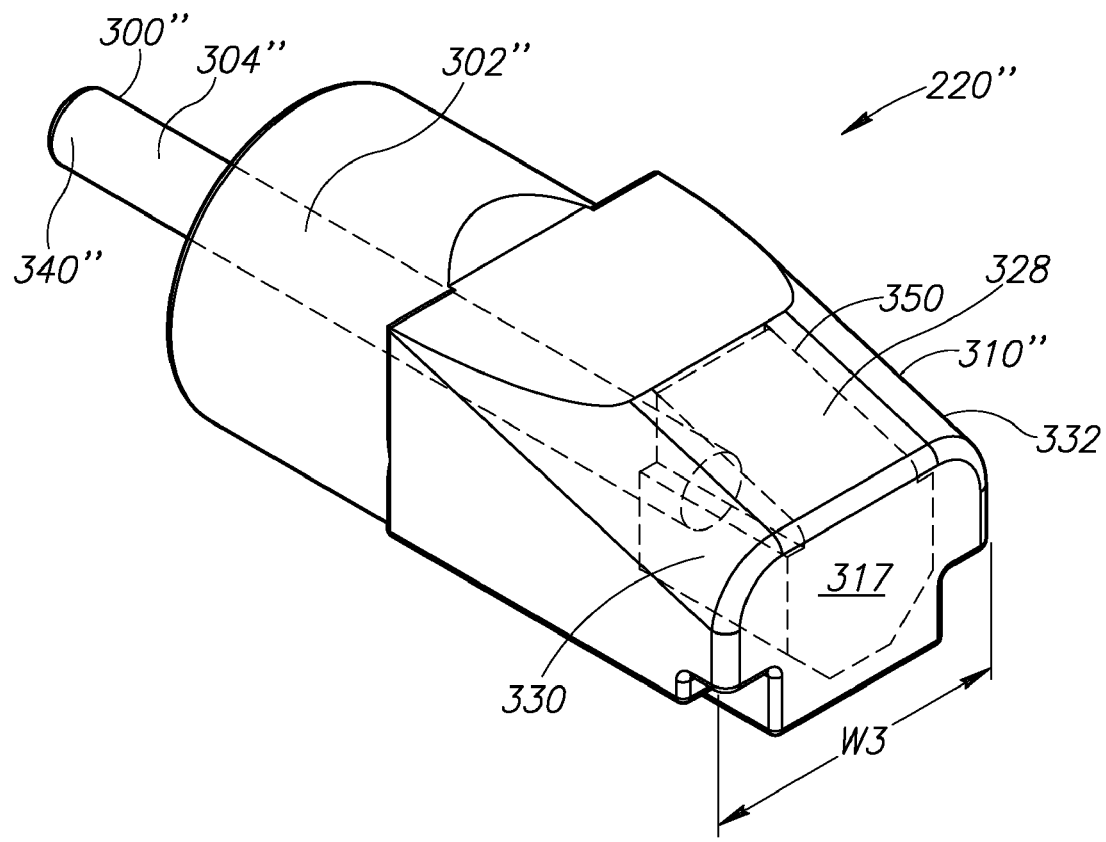
FIG. 6 is an enlarged perspective view of another alternate embodiment of a probe tip for use with the inductive amplifier unit of FIG. 2.

In an alternate embodiment illustrated in FIG. 6, a conductive member 300" of a probe tip 220" includes a conductive blade insert 350 electrically connected to a distal end portion 302" of a rod 340". Like reference numerals have been used to identify like components of the probe tip 220 and the probe tip 220". Both the conductive blade insert 350 and the distal end portion 302" of the rod 340" are completely encapsulated inside an inductive member 310". A proximal end portion 304" of the rod 340" protrudes from the inductive member 310" and may be electrically connected to the inductive generator circuit 250 (see FIG. 3). The conductive blade insert 350 is configured to provide more conductive material inside a distal portion 314" of the inductive member 310" that is inserted into the opening 130 (see FIG. 1) of the jack 110 (see FIG. 1). Increasing the amount of conductive material inside the distal portion 314" may increase the sensitivity of the probe tip 220" to an electric signal present in the tines T1-T4 (see FIG. 1) of the jack 110 (see FIG. 1).

Figure 7:
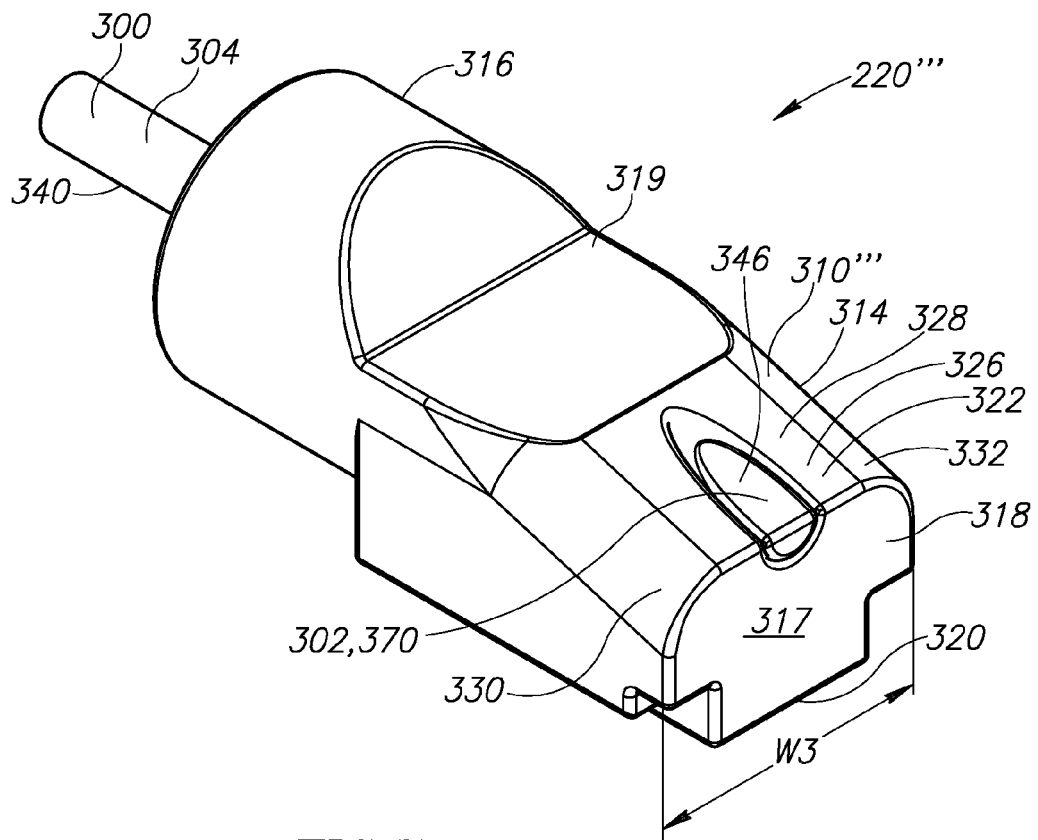
FIG. 7 is an enlarged perspective view of another alternate embodiment of a probe tip for use with the inductive amplifier unit of FIG. 2.

Referring to FIG. 7, in another alternate embodiment, an inductive member 310''' of a probe tip 220''' may not cover an exposed portion 370 of the distal end portion 302 of the conductive member 300. Like reference numerals have been used to identify like components of the probe tip 220 and the probe tip 220'''. In the embodiment illustrated, the exposed portion 370 includes the relieved portion 346 of the distal end portion 302. The exposed portion 370 may be configured to contact two of the tines T1-T4 (see FIG. 1) of the jack 110 (see FIG. 1) when the probe tip 220''' is inserted into the opening 130 (see FIG. 1) of the jack. For example, when the probe tip 220''' is inserted into the opening 130 (see FIG. 1) of the jack 110 (see FIG. 1), the exposed portion 370 may contact tines T2 and T3 (see FIG. 1).

Figure 14:
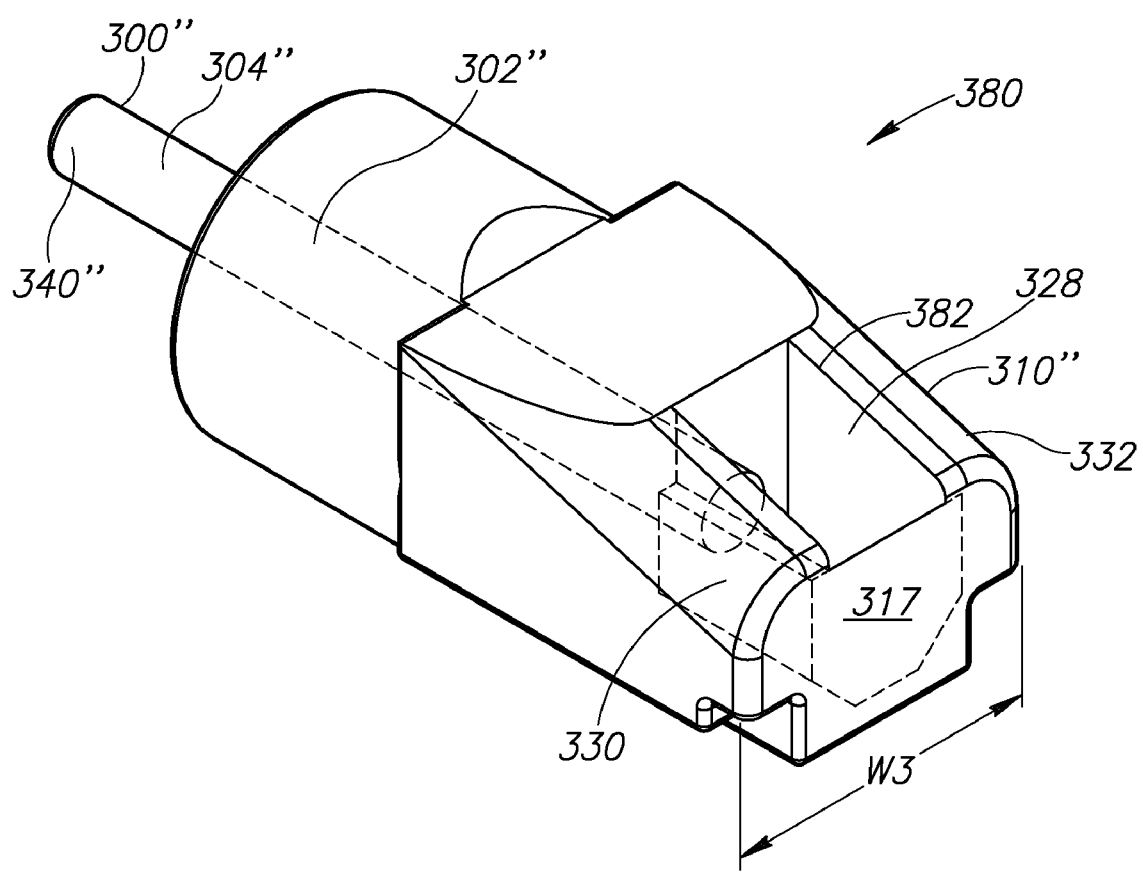
FIG. 14 is an enlarged perspective view of another alternate embodiment of a probe tip for use with the inductive amplifier unit of FIG. 2.

Turning to FIG. 14 another alternate embodiment of the probe tip 220 is shown. Like reference numerals have been used to identify like components in FIGS. 6 and 14. A probe tip 380 includes an exposed conductive insert 382 extending laterally between the rounded side portions 330 and 332. The exposed insert 382 is conductively coupled to the distal end portion 302" of the rod 340", which conducts any signal detected by the exposed insert to the inductive generator circuit 250 (see FIG. 3). The exposed insert 382 is configured to contact all of the tines T1-T4 (see FIG. 1) of the jack 110 (see FIG. 1) when the probe tip 380 is inserted into the opening 130 (see FIG. 1) of the jack.

Returning to FIG. 4, as mentioned above, the proximal end portion 304 of the conductive member 300 is configured to be electrically connected to the inductive generator circuit 250 (see FIG. 3). FIGS. 8-12 provide examples of connection mechanisms that may be used to attach the probe tip 220 to the circuit board 254 and electrically connect the proximal end portion 304 of the conductive member 300 to the inductive generator circuit 250 to provide electrical communication from the probe tip 220 to the inductive generator circuit. Any of the connection mechanisms illustrated in FIGS. 8-12 may also be used to couple the probe tip 220' (see FIG. 5) to the circuit board 254 and effect an electrical connection between the proximal end portion 304 (see FIG. 5) of the conductive member 300 (see FIG. 5) and the inductive generator circuit 250. Further, any of the connection mechanisms illustrated in FIGS. 8-12 may be used to couple the probe tip 220" (see FIG. 6) to the circuit board 254 and effect an electrical connection between the proximal end portion 304" (see FIG. 6) of the conductive member 300" (see FIG. 6) and the inductive generator circuit 250.

Figure 8:
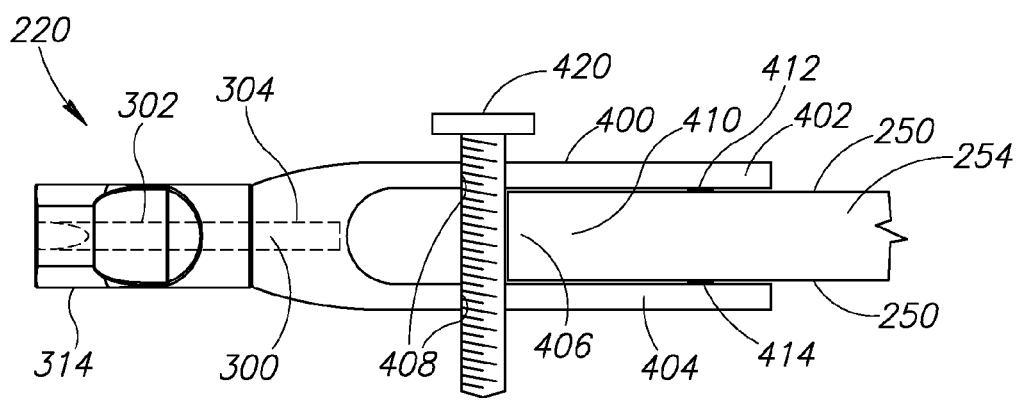
FIG. 8 is a top view of a first embodiment of a connection mechanism for connecting the probe tip of FIG. 2 to an inductive generator circuit formed on a circuit board housed inside the outer casing of the inductive amplifier unit of FIG. 2.

Turning to FIG. 8, the proximal end portion 304 of the conductive member 300 may be electrically connected to a conductive forked member 400 that includes a first conductive arm 402 spaced apart from and opposing a second conductive arm 404. A gap 406 is defined between the first and second conductive arms 402 and 404. Each of the first and second conductive arms 402 and 404 has a threaded through-hole 408. The threaded through-holes 408 of the first and second conductive arms 402 and 404 are aligned across the gap 406 and configured to receive a threaded fastener 420 (such as a screw, bolt, and the like).

An edge portion 410 of the circuit board 254 including contacts 412 and 414 is positioned in the gap 406 between the first and second conductive arms 402 and 404 of the forked member 400 with the contact 412 positioned under the first conductive arm 402 and the contact 414 positioned under the second conductive arm 404. Then, the threaded fastener 420 is threaded into the threaded through-holes 408 and tightened to draw the first and second conductive arms 402 and 404 toward one another and into clamping engagement with the edge portion 410 of the circuit board 254 with adequate clamping force to prevent disengagement of the edge portion 410 from the conductive forked member 400. The first and second conductive arms 402 and 404 are pressed into electrical engagement with the contacts 412 and 414, respectively, by the clamping force applied by the threaded fastener 420 to the first and second conductive arms 402 and 404. The contacts 412 and 414 are electrically connected to the inductive generator circuit 250 and provide an electrical connection between the first and second conductive arms 402 and 404 of the conductive forked member 400 and the inductive generator circuit 250.

Figure 9:
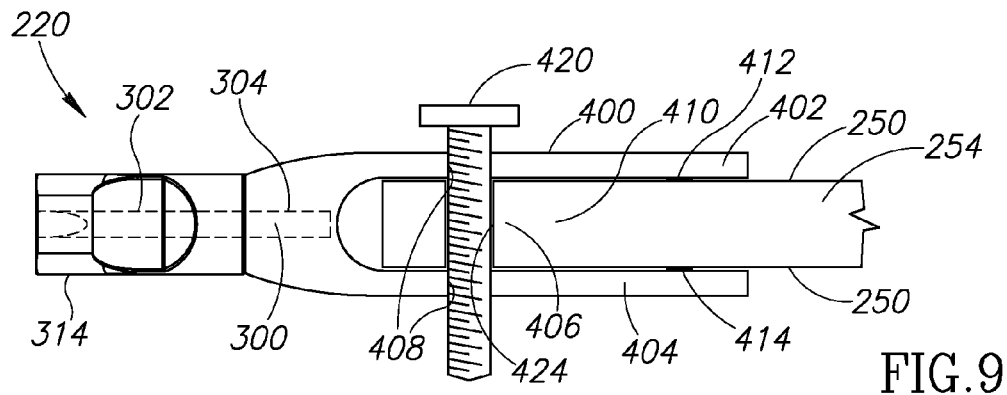
FIG. 9 is a top view of a second embodiment of a connection mechanism for connecting the probe tip of FIG. 2 to an inductive generator circuit formed on a circuit board housed inside the outer casing of the inductive amplifier unit of FIG. 2.

The connection mechanism of FIG. 9 differs from that illustrated in FIG. 8 only with respect to the inclusion of a through-hole 424 in the edge portion 410 of the circuit board 254. The threaded through-holes 408 of the first and second conductive arms 402 and 404 are aligned with the through-hole 424 so that when the threaded fastener 420 is threaded into the threaded through-holes 408 of the first and second conductive arms 402 and 404, the threaded fastener 420 passes through the through-hole 424.

Figure 10:
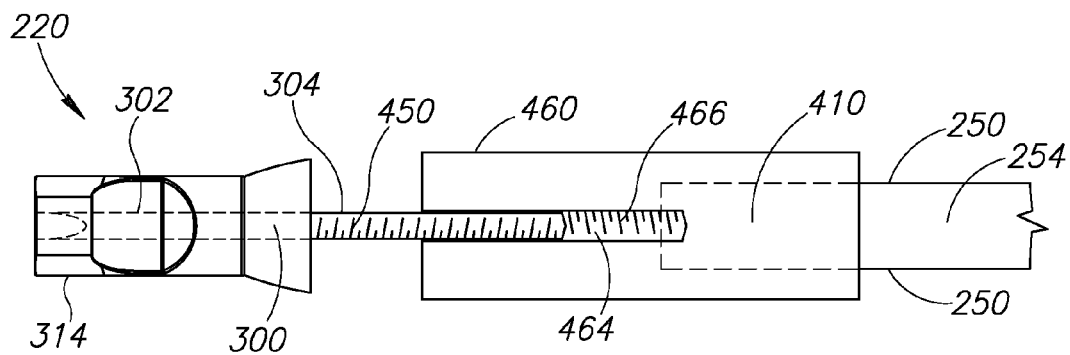
FIG. 10 is a top view of a third embodiment of a connection mechanism for connecting the probe tip of FIG. 2 to an inductive generator circuit formed on a circuit board housed inside the outer casing of the inductive amplifier unit of FIG. 2.

Turning to FIG. 10, the proximal end portion 304 of the conductive member 300 may have a substantially cylindrical shape with outside threads 450 formed therein. The edge portion 410 of the circuit board 254 includes a conductive bore 460 (also illustrated in FIG. 3) having an inside open ended channel 464 within inside threads 466 formed therein. The bore 460 is electrically connected to the inductive generator circuit 250. The outside threads 450 of the proximal end portion 304 of the conductive member 300 are configured to thread into the inside threads 466 inside the open ended channel 464 and when threaded therein to attach the probe tip 220 to the circuit board 254 and electrically connect the proximal end portion 304 of the conductive member 300 to the inductive generator circuit 250.

Figure 11:
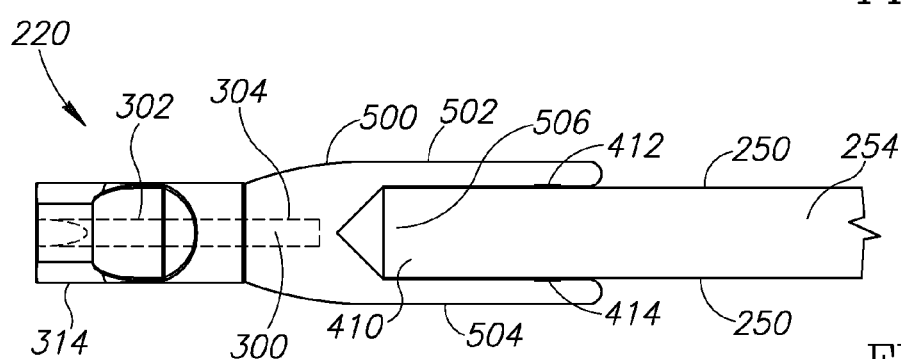
FIG. 11 is a top view of a fourth embodiment of a connection mechanism for connecting the probe tip of FIG. 2 to an inductive generator circuit formed on a circuit board housed inside the outer casing of the inductive amplifier unit of FIG. 2.

Turning to FIG. 11, the proximal end portion 304 of the conductive member 300 may be electrically connected to a conductive forked clamping member 500, which includes a first conductive arm 502 spaced apart from and opposing a second conductive arm 504. By way of a non-limiting example, the first and second conductive arms 502 and 504 may be implemented as spring arms. A gap 506 is defined between the first and second conductive arms 502 and 504. The edge portion 410 of the circuit board 254 is positioned in the gap 506 between the first and second conductive arms 502 and 504 of the forked clamping member 500, which exerts an inwardly directed clamping force on the edge portion 410 of the circuit board 254 adequate to prevent disengagement of the edge portion 410 of the circuit board 254 from the conductive clamping forked member 500. The contacts 412 and 414 are positioned under the first and second conductive arms 502 and 504, respectively. The clamping force presses the first and second conductive arms 502 and 504 into electrical engagement with the contacts 412 and 414, respectively. The contacts 412 and 414 are electrically coupled to the inductive generator circuit 250 and provide an electrical connection between the first and second conductive arms 502 and 504 of the conductive forked member 500 and the inductive generator circuit 250.

Figure 12:
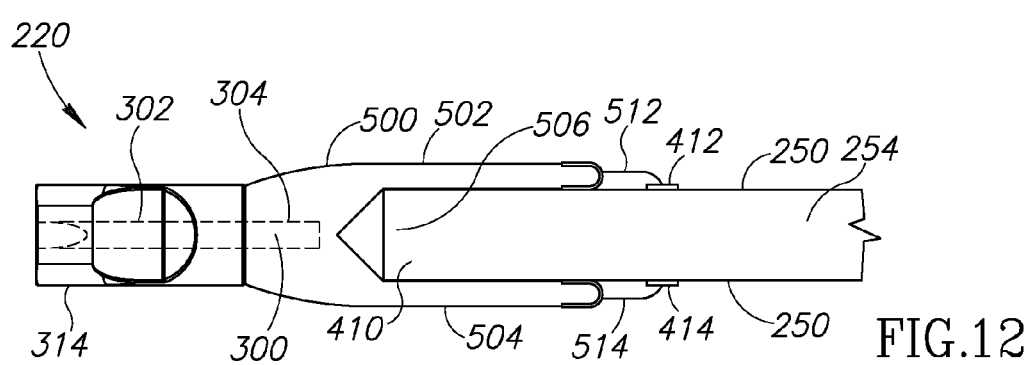
FIG. 12 is a top view of a fifth embodiment of a connection mechanism for connecting the probe tip of FIG. 2 to an inductive generator circuit formed on a circuit board housed inside the outer casing of the inductive amplifier unit of FIG. 2.

The connection mechanism of FIG. 12 differs from that illustrated in FIG. 11 only with respect to the location of the contacts 412 and 414 and how the contacts 412 and 414 are coupled to the first and second conductive arms 502 and 504, respectively. In FIG. 12, the contacts 412 and 414 are not located under the first and second conductive arms 502 and 504, respectively. Instead, the contacts 412 and 414 are spaced from the first and second conductive arms 502 and 504, respectively, along their respective sides of the circuit board 254. A first electrical conductor 512 (e.g., a first wire) is connected between the first conductive arm 502 and the contact 412 and a second electrical conductor 514 (e.g., a second wire) is connected between the second conductive arm 504 and the contact 414. Thus, the first electrical conductor 512 provides an electrical connection between the first conductive arm 502 and the inductive generator circuit 250 and the second electrical conductor 514 provides an electrical connection between the second conductive arm 504 and the inductive generator circuit 250.

As illustrated in FIGS. 8-12 numerous connection mechanisms and methods of attachment may be used to attach the probe tip 220 to the circuit board 254 and electrically connect the proximal end portion 304 of the conductive member 300 to the inductive generator circuit 250. Therefore, through application of ordinary skill in the art to the present teachings, the probe tip 220 may be configured for use with any inductive amplifier unit known in the art. For example, the probe tip 220 may be configured for use with a model number 49561 inductive amplifier unit manufactured by Leviton Manufacturing Co., Inc., a model number 200EP inductive amplifier unit manufactured by Greenlee Textron Inc. (a subsidiary of Textron Inc.), a Hound 3 inductive amplifier unit manufactured by Triplett Corporation, and the like.

Figure 13:
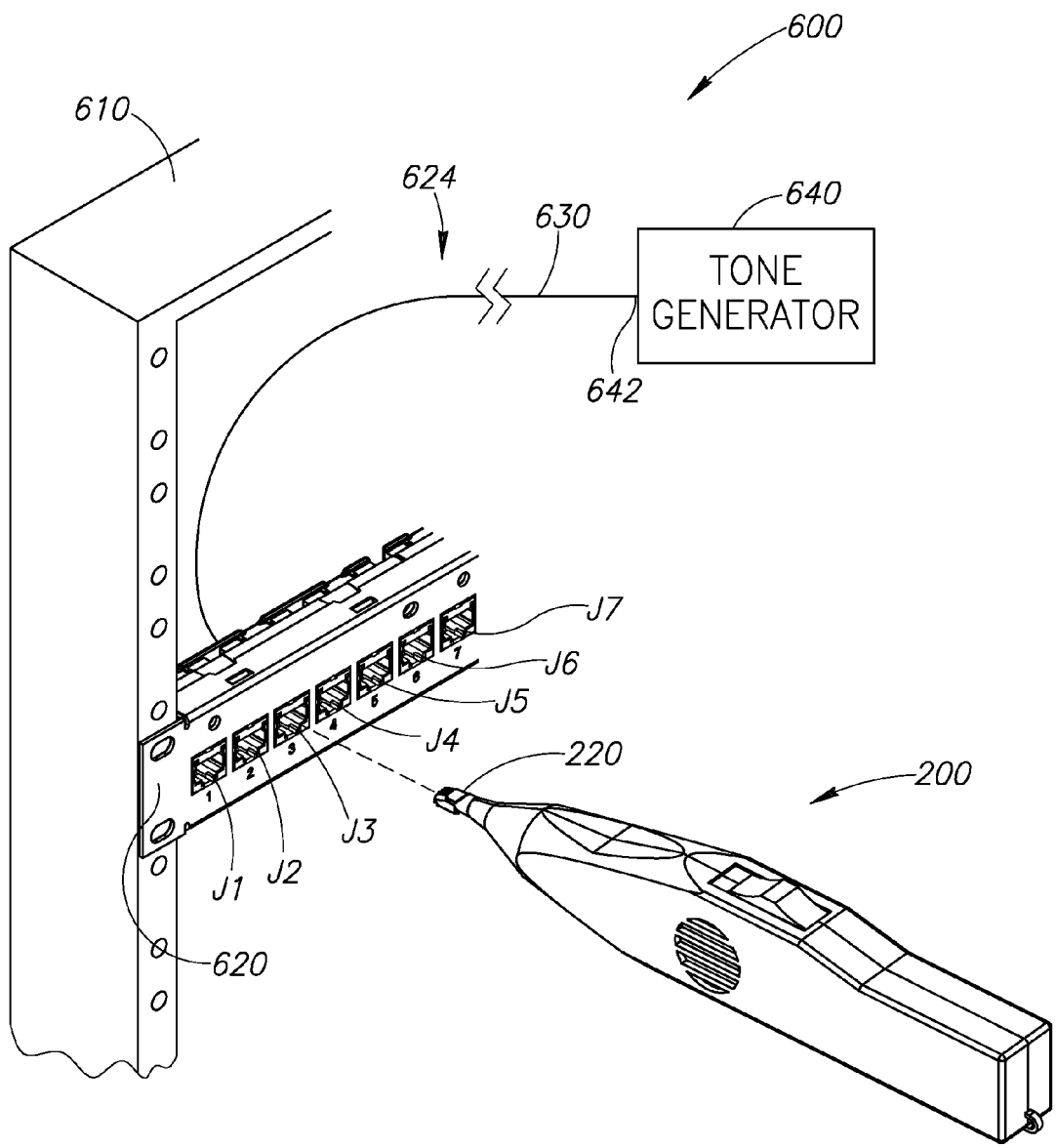
FIG. 13 is an illustration of a system incorporating the inductive amplifier unit of FIG. 2.

FIG. 13 illustrates an exemplary system 600 incorporating the inductive amplifier unit 200 including the probe tip 220. As mentioned above, the probe tip 220 is shaped to mimic the outer shape of the plug 100 (see FIG. 1), which is illustrated as a RJ-11 style plug. A RJ-11 style plug is smaller than an RJ-45 style plug. Thus, embodiments of the probe tip 220 shaped to mimic the outer shape of a RJ-11 style plug may also be inserted into RJ-45 style jacks and used to inductively detect a signal therein without damaging any contacts or tines present inside the jacks.

FIG. 13 illustrates a rack 610 and a patch panel 620 coupled to the rack. The patch panel 620 includes a plurality of jacks "J1" to "J7," which have been illustrated as RJ-45 style jacks. To determine which of the jacks "J1" to "J7" terminates a circuit 624 including a conductor 630, a tone generator 640 may be connected to the conductor 630 at a first location 642 along the conductor 630 and used to transmit a tone over the conductor 630. Then, the probe tip 220 of the inductive amplifier unit 200 is inserted into the jacks "J1" to "J7" one at a time until the tone is detected by the inductive generator circuit 250, which signals the user (e.g., by playing an audible tone using the audio transducer 252 illustrated in FIG. 3). In the example system 600 illustrated, the tone will be detected by the inductive generator circuit 250 in the jack "J3," which terminates the circuit 624. The user may choose to label the jack "J3" as terminating the circuit 624.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A probe tip for use with an inductive amplifier unit and insertion into an opening of a communication jack, the opening having a keyway portion operable to define a receiving orientation for a plug having a keyed portion, the opening being operable to prevent the reception of a plug with a keyed portion oriented in other than the receiving orientation, the probe tip comprising:

a substantially non-conducting inductive member having a keyed portion receivable inside the keyway portion of the opening of the jack when the inductive member is oriented in the receiving orientation, the inductive member being non-receivable inside the opening of the jack when oriented in other than the receiving orientation; and a conductive member having a first portion encased inside the inductive member and a second portion protruding from the inductive member, the second portion of the conductive member being attachable to the inductive amplifier unit and when so attached operable to conduct a signal inductively detected by the first portion of the conductive member to the inductive amplifier unit.

2. The probe tip of claim 1 for use with a jack further comprising a non-keyway portion and a plurality of contacts disposed inside the non-keyway portion, wherein the inductive member comprises a non-keyed portion receivable inside the non-keyway portion of the opening of the jack and when so received, positionable adjacent the plurality of contacts.

3. The probe tip of claim 2, wherein the non-keyed portion has a relieved portion positionable adjacent to the plurality of contacts when the non-keyed portion of the inductive member is received inside the non-keyway portion of the opening of the jack.

4. The probe tip of claim 3, wherein the relieved portion is configured to avoid contact of the non-keyed portion with the plurality of contacts.

5. The probe tip of claim 3, wherein the relieved portion is configured to avoid the non-keyed portion deflecting the plurality of contacts.

6. The probe tip of claim 3, wherein the relieved portion is located between a pair of rounded edge portions of the non-keyed portion.

7. The probe tip of claim 3, wherein the first portion of the conductive member has an end portion opposite the second portion, the end portion being adjacent the relieved portion.

8. The probe tip of claim 1, wherein the first portion of the conductive member has an end portion opposite the second portion, the end portion having an exposed portion not encased inside the inductive member.

9. The probe tip of claim 1, wherein the first portion of the conductive member comprises a blade member encased inside the inductive member connected to a first end portion of a conducting rod encased inside the inductive member and the second portion of the conductive member comprises a second end portion of the conducting rod that protrudes from the inductive member.

10. A probe tip for use with an inductive amplifier unit and insertion into an opening in a communication jack, the opening having a stop mechanism, and a plurality of contacts disposed inside, the probe tip comprising:
   a substantially non-conducting inductive member having a blunt end to be disposed inside the opening in the communication jack when the probe tip is inserted into the opening in the communication jack, the blunt end being configured to contact the contacts inside the opening and apply at most an amount of contact force thereto when the blunt end engages the stop mechanism, the amount of contact force being insufficient to damage the contacts inside the opening; and
   a conductive member having a first end portion at least partially encased inside the blunt end of the inductive member and a second end portion extending outwardly away from the blunt end.

11. The probe tip of claim 10 for use with a communication jack having an opening with a keyway portion, the blunt end of the substantially non-conducting inductive member comprising a key portion receivable inside the keyway portion of the opening of the communication jack, engagement between the keyway portion and the key portion received therein allowing insufficient lateral movement of the blunt end inside the opening to permanently deform the contacts inside the opening as a result of the lateral movement.

12. The probe tip of claim 10 for use with an inductive amplifier unit and insertion into an opening in a communication jack configured to receive a communication plug having an outer shape, wherein the blunt end of the probe tip has an outer shape substantially identical to the outer shape of the communication plug.

13. The probe tip of claim 10, wherein the first end portion of the conductive member is completely encased inside the blunt end of the inductive member.

14. The probe tip of claim 10, wherein the blunt end of the inductive member comprises a relieved portion that is positioned adjacent to the plurality of contacts when the probe tip is inserted into the opening in the communication jack.

15. The probe tip of claim 10, wherein the first end portion of the conductive member comprises a blade member encased inside the blunt end of the inductive member connected to a first end portion of a conducting member.

16. A probe tip for use with an inductive amplifier unit and insertion into an open internal portion of a communication jack, the opening housing a plurality of bendable contacts, the probe tip comprising a distal portion configured to be inserted into the open internal portion of the jack and comprising a relieved portion that is positioned adjacent to but spaced apart from the plurality of bendable contacts when the distal portion is inserted into the open internal portion of the jack, the distal portion being configured to conform to the open internal portion of the jack such that movement of the distal portion inside the open internal portion is adequately restricted to prevent contact between the distal portion and the plurality of bendable contacts.

17. An inductive amplifier unit operable to detect a tone transmitted by a tone generator over a conductor at a plurality of locations along the conductor, the conductor being coupled to a communication jack comprising a plurality of contacts, the inductive amplifier unit comprising a probe tip having an outer shape receivable inside the communication jack and occupying a majority portion of the space inside the communication jack thereby leaving insufficient space between the probe tip and the inside of the communication jack to permit adequate lateral movement of the probe tip inside the communication jack to rake the probe tip across the plurality of contacts inside of the communication jack.

18. The inductive amplifier unit of claim 17, wherein the outer shape of the probe tip leaves sufficient space between the probe tip and the inside of the communication jack to prevent the probe tip from being held inside the communication jack without an application of external force.

19. A system for identifying a termination location of a circuit comprising a conductor connected to the termination location, the termination location being one of a plurality of communication jacks each comprising an opening with a keyway portion and a plurality of contacts, the system comprising:
   a tone generator couplable to the conductor and operable to transmit a tone over the conductor;
   an inductive amplifier unit operable to detect the tone transmitted by the tone generator over the conductor at a plurality of locations along the conductor, the inductive amplifier unit comprising a probe tip insertable into each of the plurality of communication jacks, the probe tip comprising a key portion receivable inside the keyway portion of one of the communication jacks, engagement between the keyway portion and the key portion received therein allowing insufficient lateral movement of the probe tip inside the opening of the communication jack to permanently deform the plurality of contacts inside the opening as a result of the lateral movement.

20. The system of claim 19, wherein the probe tip further comprises:
   a relieved portion that is adjacent to the plurality of contacts when the probe tip is inserted inside one of the plurality of communication jacks, the relieved portion being operable to limit engagement between the probe tip and the plurality of contacts.

21. The system of claim 20, wherein the relieved portion is tapered toward a distal end of the probe tip.

22. An inductive amplifier unit for use by a user, the unit comprising:
   an inductive generator circuit;
   a probe tip connected to the inductive generator circuit and configured to conduct a signal detected by the probe tip to the inductive generator circuit, the probe tip comprising an outer shape configured to be inserted inside a jack having a plurality of internal contacts, the probe tip having an outer shape configured such that movement of the probe tip inside the jack is adequately restricted to prevent sufficient movement of the probe tip inside the jack to permanently deform the internal contacts as a result of the movement; and
   an indicator connected to the inductive generator circuit, the inductive generator circuit being configured to use the indicator to indicate to the user when the probe tip has conducted a signal to the inductive generator circuit.

23. The inductive amplifier unit of claim 22, wherein the probe tip comprises a conducting member connected to a forked member having a first conducting arm separated from a second conducting arm by a gap, the conducting member of the probe tip being electrically connected to the first and second conducting arms, an edge portion of the inductive generator circuit being disposed inside the gap, the edge portion having a first electrical contact electrically connected to the first conducting arm and a second electrical contact electrically connected to the second conducting arm.

24. The inductive amplifier unit of claim 23, wherein the first and second conducting arms each include a through-hole, the through-holes of the first and second conducting arms being juxtaposed across the gap, and the inductive amplifier unit further comprises:

a fastener disposed inside the through-holes of the first and second conducting arms and configured to draw the first and second conducting arms toward one another and into clamping engagement with the edge portion of the inductive generator circuit.

25. The inductive amplifier unit of claim 24, wherein the edge portion of the inductive generator circuit comprises a through-hole configured to receive the fastener, the through-hole of the inductive generator circuit being aligned with the through-holes of the first and second conducting arms, the fastener disposed inside the through-holes of the first and second conducting arms passing through the through-hole of the inductive generator circuit.

26. The inductive amplifier unit of claim 22, wherein the probe tip comprises a threaded conducting member threadedly engaged with a threaded conducting bore electrically connected to the inductive generator circuit.

* * * * *